(12) United States Patent
Baek et al.

(10) Patent No.: US 9,136,138 B2
(45) Date of Patent: Sep. 15, 2015

(54) EQUIPMENT FOR MANUFACTURING SEMICONDUCTOR DEVICE AND SEASONING PROCESS METHOD OF THE SAME

(75) Inventors: Kye Hyun Baek, Suwon-si (KR); Sangwuk Park, Osan-si (KR); Geum Jung Seong, Seoul (KR); Yongjin Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 356 days.

(21) Appl. No.: 13/115,401

(22) Filed: May 25, 2011

(65) Prior Publication Data
US 2011/0295554 A1 Dec. 1, 2011

(30) Foreign Application Priority Data

May 26, 2010 (KR) ........................ 10-2010-0049284

(51) Int. Cl.
*G06F 17/18* (2006.01)
*G05B 23/02* (2006.01)
*H01L 21/3065* (2006.01)
*G05B 17/02* (2006.01)
*H01J 37/32* (2006.01)

(52) U.S. Cl.
CPC ............ *H01L 21/3065* (2013.01); *G05B 17/02* (2013.01); *H01J 37/3288* (2013.01); *H01J 37/3299* (2013.01); *H01J 37/32853* (2013.01); *H01J 37/32981* (2013.01)

(58) Field of Classification Search
CPC .......... G06F 19/00; G06F 15/00; G06F 17/10
USPC ....................................................... 702/179
See application file for complete search history.

(56) References Cited

U.S. PATENT DOCUMENTS

| | | | | |
|---|---|---|---|---|
| 125,660 | A | * | 4/1872 | Carmack ................. 366/325.92 |
| 5,647,953 | A | * | 7/1997 | Williams et al. ............... 134/1.1 |
| 6,046,796 | A | * | 4/2000 | Markle et al. ................... 356/72 |
| 6,267,121 | B1 | | 7/2001 | Huang et al. |

(Continued)

FOREIGN PATENT DOCUMENTS

| | | |
|---|---|---|
| JP | 03014229 | 1/1991 |
| JP | 200431380 | 1/2004 |

(Continued)

OTHER PUBLICATIONS

Belkind and Gershman, Plasma Cleaning of Surfaces 2008.*

*Primary Examiner* — Sujoy Kundu
*Assistant Examiner* — Alvaro Fortich
(74) *Attorney, Agent, or Firm* — Harness, Dickey & Pierce, P.L.C.

(57) ABSTRACT

Disclosed is an apparatus for processing a semiconductor and a method for generating a seasoning process of a reaction chamber. The method may include generating plasma in the reaction chamber using a production process recipe, obtaining at least one reference measurement value related to a byproduct of the generated plasma, performing a plurality of seasoning tests on the chamber to obtain a plurality of test results, generating an empirical model by forming at least one relational expression correlating variables manipulated during the performing of the plurality of seasoning tests to the plurality of test results, and estimating a seasoning process by using the at least one relational expression to estimate at least one estimated calculation value.

23 Claims, 14 Drawing Sheets

(56) References Cited

U.S. PATENT DOCUMENTS

| | | | |
|---|---|---|---|
| 6,274,058 B1* | 8/2001 | Rajagopalan et al. | 216/67 |
| 6,274,500 B1* | 8/2001 | Xuechun et al. | 438/706 |
| 6,313,583 B1* | 11/2001 | Arita et al. | 315/111.21 |
| 6,350,697 B1* | 2/2002 | Richardson et al. | 438/710 |
| 6,399,507 B1* | 6/2002 | Nallan et al. | 438/706 |
| 6,464,794 B1* | 10/2002 | Park et al. | 118/728 |
| 6,660,127 B2* | 12/2003 | Nallan et al. | 156/345.48 |
| 6,708,700 B2* | 3/2004 | Raaijmakers et al. | 134/57 R |
| 6,797,634 B2* | 9/2004 | Suzuki | 438/706 |
| 6,889,697 B2* | 5/2005 | Young et al. | 134/1.1 |
| 7,093,205 B2* | 8/2006 | Heydler et al. | 716/104 |
| 7,109,114 B2* | 9/2006 | Chen et al. | 438/680 |
| 7,118,926 B2* | 10/2006 | Cho et al. | 438/9 |
| 7,147,747 B2 | 12/2006 | Miya et al. | |
| 7,166,535 B2* | 1/2007 | Li et al. | 438/706 |
| 7,297,607 B2* | 11/2007 | Jo | 438/339 |
| 7,311,109 B2* | 12/2007 | Kim et al. | 134/1.2 |
| 7,340,320 B2* | 3/2008 | Takizawa et al. | 700/121 |
| 7,669,150 B2* | 2/2010 | Li et al. | 716/132 |
| 7,867,921 B2 | 1/2011 | Wang et al. | |
| 8,244,500 B2* | 8/2012 | Tian et al. | 702/182 |
| 2001/0010228 A1* | 8/2001 | Au et al. | 134/1.1 |
| 2002/0006675 A1* | 1/2002 | Shigaraki | 438/4 |
| 2002/0045353 A1* | 4/2002 | Kang | 438/710 |
| 2003/0032207 A1* | 2/2003 | Rengarajan et al. | 438/14 |
| 2003/0055618 A1* | 3/2003 | Masuda | 703/2 |
| 2003/0170984 A1* | 9/2003 | Yamamoto et al. | 438/689 |
| 2003/0192856 A1* | 10/2003 | Balasubramaniam et al. | 216/56 |
| 2004/0147131 A1* | 7/2004 | Kitsunai et al. | 438/710 |
| 2004/0166598 A1* | 8/2004 | Miya et al. | 438/9 |
| 2005/0143952 A1* | 6/2005 | Tomoyasu et al. | 702/181 |
| 2005/0145333 A1* | 7/2005 | Kannan et al. | 156/345.24 |
| 2005/0224458 A1* | 10/2005 | Gaudet et al. | 216/67 |
| 2005/0235917 A1* | 10/2005 | Fordemwalt et al. | 118/723 R |
| 2005/0251373 A1* | 11/2005 | Daems et al. | 703/2 |
| 2006/0118520 A1* | 6/2006 | Morikita et al. | 216/67 |
| 2006/0141798 A1* | 6/2006 | Jo | 438/725 |
| 2006/0144817 A1* | 7/2006 | Balasubramaniam et al. | 216/59 |
| 2006/0151429 A1* | 7/2006 | Kitsunai et al. | 216/59 |
| 2006/0212156 A1* | 9/2006 | Tanaka et al. | 700/121 |
| 2006/0218680 A1* | 9/2006 | Bailey, III | 901/14 |
| 2006/0254515 A1* | 11/2006 | Blanco et al. | 118/715 |
| 2006/0254614 A1* | 11/2006 | Blanco et al. | 134/1.1 |
| 2007/0020780 A1* | 1/2007 | Baek et al. | 438/14 |
| 2007/0201016 A1* | 8/2007 | Song et al. | 356/72 |
| 2007/0275569 A1* | 11/2007 | Moghadam et al. | 438/781 |
| 2007/0289609 A1* | 12/2007 | Lim et al. | 134/22.1 |
| 2008/0046846 A1* | 2/2008 | Chew et al. | 716/2 |
| 2008/0190446 A1* | 8/2008 | Ranade et al. | 134/1 |
| 2008/0216957 A1* | 9/2008 | Ogasawara et al. | 156/345.29 |
| 2008/0237184 A1* | 10/2008 | Yakushiji et al. | 216/67 |
| 2009/0166618 A1* | 7/2009 | Mowry et al. | 366/325.92 |
| 2009/0317977 A1* | 12/2009 | Takase | 438/703 |
| 2010/0018649 A1* | 1/2010 | Nishio et al. | 156/345.48 |
| 2010/0024186 A1* | 2/2010 | Bailey, III | 29/402.04 |
| 2010/0154835 A1* | 6/2010 | Dimeo et al. | 134/31 |
| 2010/0224913 A1* | 9/2010 | Chiang et al. | 257/253 |
| 2011/0083808 A1* | 4/2011 | Kagoshima et al. | 156/345.24 |
| 2011/0132874 A1* | 6/2011 | Gottscho et al. | 216/67 |

FOREIGN PATENT DOCUMENTS

| | | |
|---|---|---|
| KR | 100473856 | 7/2002 |
| KR | 100557673 | 6/2005 |

* cited by examiner

EQUIPMENT FOR MANUFACTURING SEMICONDUCTOR DEVICE AND SEASONING PROCESS METHOD OF THE SAME

CROSS-REFERENCE TO RELATED APPLICATIONS

This U.S. non-provisional patent application claims priority under 35 U.S.C. §119 to Korean Patent Application No. 10-2010-0049284, filed on May 26, 2010, in the Korean Intellectual Property Office (KIPO), the entire contents of which are hereby incorporated by reference.

BACKGROUND

1. Field

The present disclosure herein relates to equipment for manufacturing a semiconductor device and a method for generating a seasoning process of the same, and more particularly, to equipment for manufacturing a semiconductor device where a seasoning process is performed after cleaning a plasma reaction chamber and a method for generating the seasoning process.

2. Description of the Related Art

Generally, a semiconductor device is manufactured through a plurality of unit processes comprising a deposition process for a thin film and an etching process. The etching process may be mostly performed within semiconductor device manufacturing equipment where the plasma reaction is induced. The semiconductor device manufacturing equipment is wet-cleaned according to preventive maintenance whenever it is used for a predetermined time for removing contaminants of polymer component excessively generated on an inner wall of the chamber due to the plasma reaction. Accordingly, it is required to perform the seasoning process to the chamber for stabilizing the plasma reaction right after the wet-cleaning.

SUMMARY

The present disclosure provides semiconductor device manufacturing equipment and a method of generating a seasoning process of the same capable of increasing reproducibility of the seasoning process.

The present disclosure also provides semiconductor device manufacturing equipment and a method of generating a seasoning process of the same capable of increasing or maximizing productivity.

In accordance with an example embodiment of the inventive concepts, a method for seasoning semiconductor device manufacturing equipment may include obtaining at least one reference measurement value according to a reference process recipe of a plasma reaction before cleaning a chamber, selecting variables which affect the plasma reaction of the reference process recipe, obtaining test measurement values by performing seasoning tests on the chamber, the test measurement values being associated with tests in which the selected variables are manipulated, and estimating at least one estimated calculation value approximate to the at least one reference measurement value and a seasoning process recipe from a correlation of the manipulated variables and the test measurement values.

In accordance with an example embodiment of the inventive concepts, a method for seasoning semiconductor device manufacturing equipment may include generating plasma in a reaction chamber using a production process recipe, obtaining at least one reference measurement value related to a byproduct of the generated plasma, performing a plurality of seasoning tests on the chamber to obtain a plurality of test results, generating an empirical model by forming at least one relational expression correlating variables manipulated during the performing of the plurality of seasoning tests to the plurality of test results, estimating a seasoning process by using the at least one relational expression to calculate at least one estimated calculation value, and seasoning the reaction chamber using the seasoning process.

Example embodiments of the inventive concepts provide methods for optimizing a seasoning process of a semiconductor device manufacturing equipment comprising obtaining reference measurement values according to a reference process recipe of a plasma reaction before cleaning a chamber; selecting manipulated variables which affect a change of the plasma reaction from the reference process recipe; obtaining test measurement values according to a change of the manipulated variables by performing seasoning tests of the chamber which induces the plasma reaction changing the manipulated variables after cleaning the chamber; and calculating at least one estimated calculation value approximate to the reference measurement value and an optimum seasoning process recipe from a correlation of the manipulated variables and the test measurement values.

In some embodiments, generating an empirical model according to the correlation of the manipulated variables and the test measurement values may be further included.

In other embodiments, the number of the generated empirical model may be equal to that of the reference measurement values.

In still other embodiments, the empirical model may include the estimated calculation values according to a combination of the manipulated variables.

In even other embodiments, the estimated calculation values may correspond to a relational expression of the manipulated variables.

In yet other embodiments, the empirical model may include a square error of the reference measurement values and the estimated calculation values.

In further embodiments, the optimum seasoning process recipe may be calculated in least-squares method by adding the square error and minimizing it.

In still further embodiments, the optimum seasoning process recipe may correspond to a vertex calculated from the square error of the second-order polynomial expression.

In even further embodiments, the vertex may be calculated by partial differentiating the square error of the second-order polynomial expression for the manipulated variables or calculated from optimization logic.

In yet further embodiments, the optimum seasoning process recipe, in the case that the vertex exists out of a constraint range, may correspond to a minimum manipulated variable within the constraint range.

In much further embodiments, the seasoning tests may be performed according to a regression analysis of the manipulated variables.

In still much further embodiments, the regression analysis may include a design of experiment.

In even much further embodiments, the design of experiment may include a Box-Benken method.

In yet much further embodiments, the reference measurement values may include at least one of optical measurement value and electrical measurement value of the plasma reaction whose difference between a patterned wafer and a bare wafer according to the reference process recipe is large.

In yet still much further embodiments, the optical measurement value may include a spectrum wavelength range of the plasma reaction.

In yet still much further embodiments, the optimum seasoning process recipe may follow the same sequence as the reference process recipe.

In yet still much further embodiments, the optimum seasoning process recipe may include a first oxide layer seasoning process for removing a natural oxide layer performed according to the reference process recipe of a trench forming process and a first silicon layer seasoning process for removing a silicon layer.

In yet still much further embodiments, the optimum seasoning process recipe may further include the first oxide layer seasoning process, at least one oxide layer forming process sequentially performed following the first silicon layer seasoning process, a second oxide layer seasoning process, and a second silicon seasoning process.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings.

DETAILED DESCRIPTION OF THE EXAMPLE EMBODIMENTS

Figure 1:
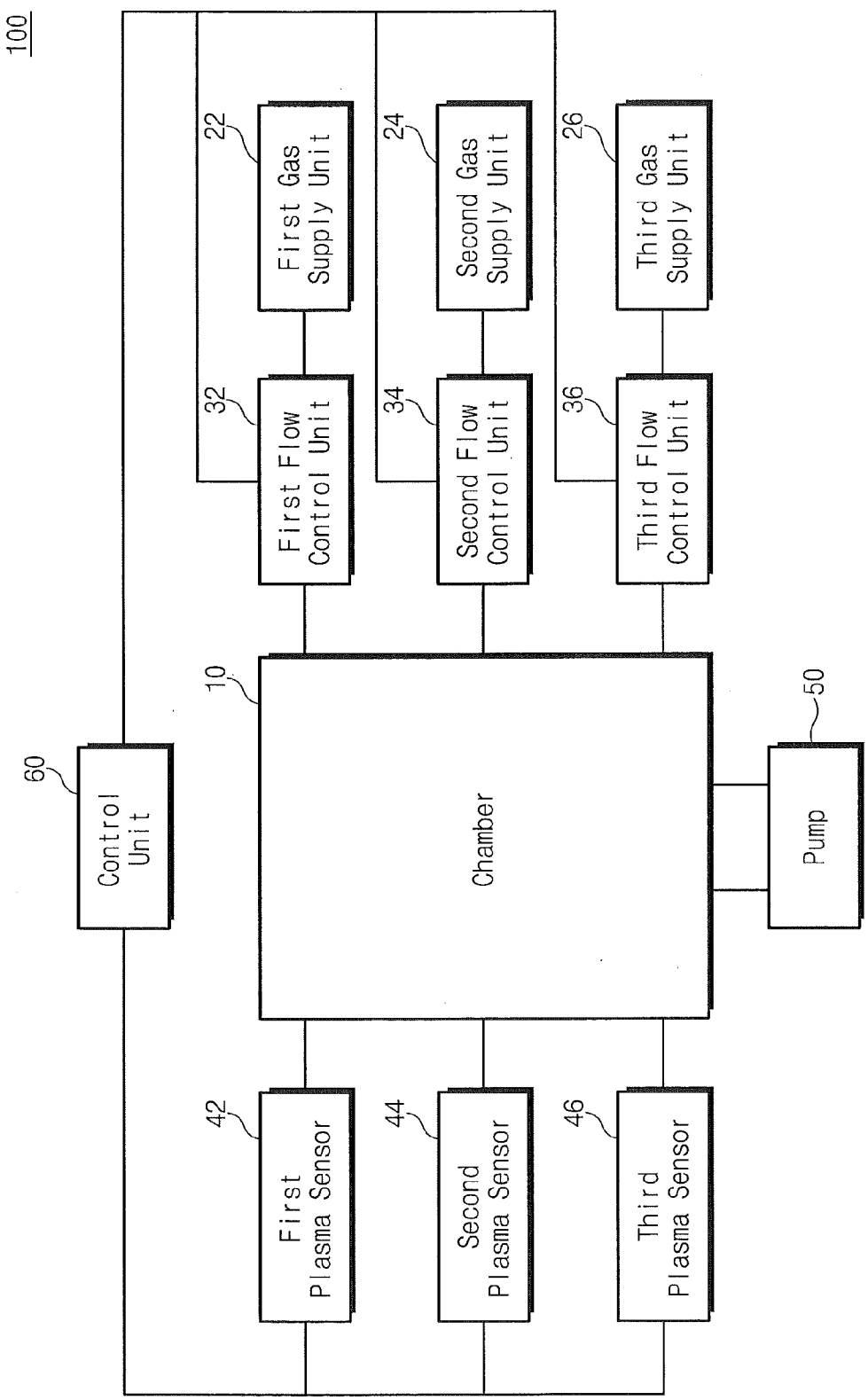
FIG. 1 is a schematic diagram illustrating a semiconductor device manufacturing equipment according to an example embodiment of the inventive concepts.

Example embodiments of the inventive concepts will be described below in more detail with reference to the accompanying drawings. The inventive concepts may, however, be embodied in different forms and should not be construed as limited to the example embodiments set forth herein. Rather, the example embodiments are provided so that this disclosure will be thorough and complete, and will fully convey the scope of the inventive concepts to those skilled in the art. Like reference numerals refer to like elements throughout.

The terms used in this disclosure are not for limiting the inventive concepts but for explaining the example embodiments. The terms of a singular form may include plural forms unless otherwise specified. Also, the meaning of "include," "comprise," "including," or "comprising," specifies a property, a region, a fixed number, a step, a process, an element and/or a component but does not exclude other properties, regions, fixed numbers, steps, processes, elements and/or components. The reference numerals presented according to a sequence of explanations are not limited to the sequence.

Hereinafter, example embodiments of the inventive concepts will be described in detail with reference to the accompanying drawings.

FIG. 1 is a schematic diagram illustrating equipment 100 for manufacturing a semiconductor device in accordance with an example embodiment of the inventive concepts.

Referring to FIG. 1, the equipment 100 may include a control unit 60 for controlling first to third flow control units 32, 34, and 36. The control unit 60 may control different process recipes of a semiconductor device production process and may also control a seasoning process that generates byproducts of a plasma reaction after cleaning a chamber 10. In this example embodiment, the by products may be equally generated. The control unit 60 may obtain a production measurement value from first to third plasma sensors 42, 44, and 46 during or after the semiconductor device production process is performed according to a production process recipe before cleaning the chamber 10. The semiconductor device production process is a unit process where a patterned wafer is fabricated within the chamber 10 and includes a reference process having excellent production yield. The production measurement value may include a reference measurement value. The seasoning process may include a preliminary process for making the inside of the chamber 10 suitable for performing the semiconductor device production process after cleaning the chamber 10. For the seasoning process, the plasma reaction of a bare wafer may be performed within the chamber 10.

The control unit 60 may obtain a plurality of test measurement values from seasoning tests that are performed after the chamber 10 is cleaned. The control unit 60 may compute estimated calculation values according to a change of the test measurement values and produce a seasoning test process recipe for the first to third flow control unit 32 to 36 from the estimated calculation values. Accordingly, the control unit 60 may select the estimated calculation value approximate to the production measurement value and produce an optimum seasoning process recipe according to the estimated calculation value.

The chamber 10 may provide inner space independent of the outside. A pump 50 may pump air into or out of the chamber 10. The chamber 10 may include an etch chamber where a wafer or a thin layer on the wafer is etched by the plasma reaction. Within the etch chamber, an etch process may be performed for patterning the wafer or at least one of a silicon layer, an oxide layer, a nitride layer, and a metal layer on the wafer. The etch chamber may be connected to a transfer chamber buffering vacuum state and a load-lock chamber as a cluster type.

First to a third gas supply units 22, 24, and 26 may supply a reaction gas and an inactive gas for etching the wafer or the thin layer into the chamber 10. For example, each of the first and second gas supply units 22 and 24 may supply at least one reaction gas such as nitrogen ($N_2$), oxygen ($O_2$), chlorine ($Cl_2$), carbon tetrafluoride ($CF_4$), and bromic acid (HBr) to the chamber 10. The third gas supply unit 26 may supply the inactive gas such as argon to the chamber 10. The first to third flow control units 32, 34, and 36 may include a valve for controlling a flow rate of the reaction gas and the inactive gas supplied into the chamber 10. The third flow control unit 36 may be a pressure controller for controlling pressure in the chamber 10.

Preventive Maintenance (PM), e.g. wet-cleaning, for the chamber 10, may be periodically performed every accumulated time of the semiconductor device production process for removing a polymer component generated as byproducts of the etch process. The polymer component may be deposited on an inner wall of the chamber 10 whenever the semiconductor device production process is performed. In the case that the polymer component is piled up to more than a certain thickness, a lump of the polymer component may fall onto the wafer from the inner wall of the chamber 10 and act as a particle contaminating a surface. For example, the PM for the chamber 10 may be periodically performed every about 100 hours of accumulated use time.

Right after the PM of the chamber 10 is performed, etch characteristics of a wafer or thin layer may be unstable. For example, after the wet-washing for the chamber 10, the plasma reaction may be unstable, or etch rate reproducibility of the wafer or thin layer may be degraded. To overcome this problem, a seasoning process for the chamber 10 using a bare wafer may be performed. The seasoning process may include a preliminary etch process for coating the inner wall of the chamber 10 with the polymer component. The polymer component may affect the plasma reaction within the chamber 10.

First to a third plasma sensors 42, 44, and 46 may sense the plasma reaction in the chamber 10 optically or electrically. For example, the first plasma sensor 42 may include an Optical Emission Spectroscope (OES) for measuring light of the plasma reaction. The second plasma sensor 44 may include a Self-Excited Electron Resonance Spectroscope (SEERS). The third plasma sensor 46 may include a voltage-current (V-I) probe for probing a voltage and a current of the plasma reaction.

The control unit 60 may produce a seasoning process recipe for equally implementing optical or electrical characteristics of the plasma reaction during the semiconductor device production process at the seasoning process. The control unit 60 may obtain measurement values for the plasma reaction in the chamber 10 from the first to third plasma sensors 42, 44, and 46.

As above-described, the control unit 60 may obtain a production measurement value and an estimated calculation value of the plasma reaction at the semiconductor production process and the seasoning test. The control unit 60 may select an estimated seasoning process recipe corresponding to the estimated calculation value approximate to the production measurement value as the optimum seasoning process recipe.

Accordingly, since the semiconductor device manufacturing equipment 100 according to the example embodiment of the inventive concepts includes the control unit 60 for controlling the first to third flow control units 32, 34, and 36 for generating the byproducts of the plasma reaction of the semiconductor device production process in the same quantity also at the seasoning process, the reproducibility of the seasoning process of the chamber 10 may be improved. Also, since the control unit 60 is capable of producing the optimum seasoning process recipe, productivity and production yield may be maximized.

Figure 2:
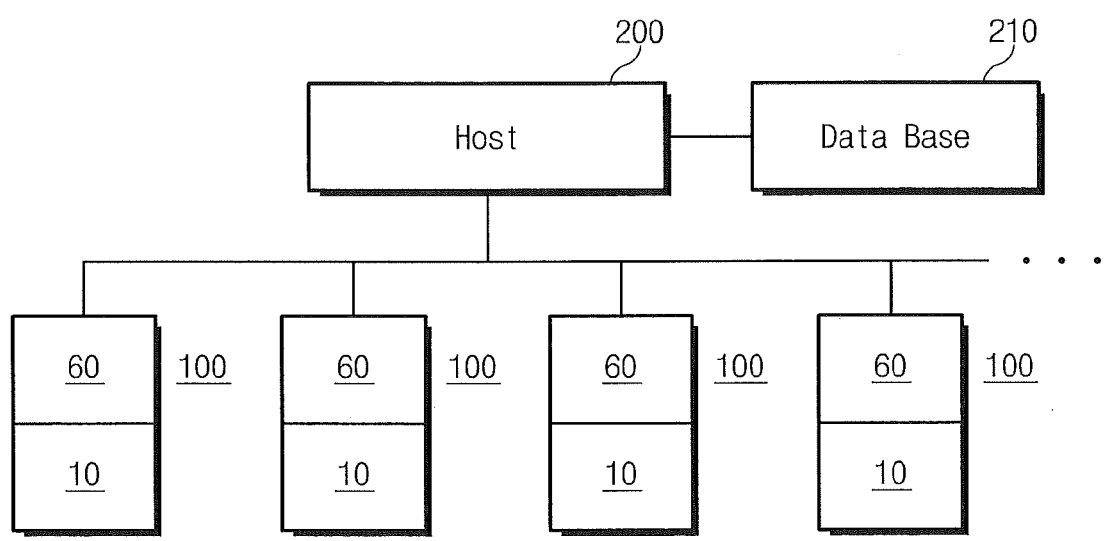
FIG. 2 is a diagram illustrating a management system of the semiconductor device manufacturing equipment illustrated in FIG. 1.

FIG. 2 is a diagram illustrating a management system of the semiconductor device manufacturing equipment illustrated in FIG. 1. A host computer 200 may receive information of the seasoning process recipe produced by the control unit 60 of the semiconductor device manufacturing equipment 100 and store it in a data base 210. Also, the host computer 200 may output the seasoning process recipe information to the control units 60 of the semiconductor device manufacturing equipments 100 required to perform the seasoning process for whole semiconductor device production lines.

The host computer 200 may share or exchange the seasoning process recipe information with the control unit 60 of the semiconductor device manufacturing equipment 100 through a Semi Equipment Communications Standard (SECS) protocol or a Transmission Control Protocol/Internet Protocol (TCP/IP).

Accordingly, the management system of the semiconductor device manufacturing equipment 100 according to the example embodiment of the inventive concepts may store the optimum seasoning process information in the data base 210 and output it to the semiconductor device manufacturing equipment 100 through the host computer 200 if necessary.

As above, the semiconductor device manufacturing equipment 100 and its management system according to the example embodiments of the inventive concepts have been described referring to FIGS. 1 and 2. However, this is just an exemplary explanation of the inventive concepts not meaning that the inventive concepts are limited to the above-described equipment and system. That is, the semiconductor device manufacturing equipment 100 according to the inventive concepts may be applied to equipments for massively manufacturing semiconductor devices directly or in a modified form based on the above and below described inventive concepts.

A method for optimizing the seasoning process of the semiconductor device manufacturing equipment 100 according to the example embodiment of the inventive concepts is described below in detail.

Figure 3:
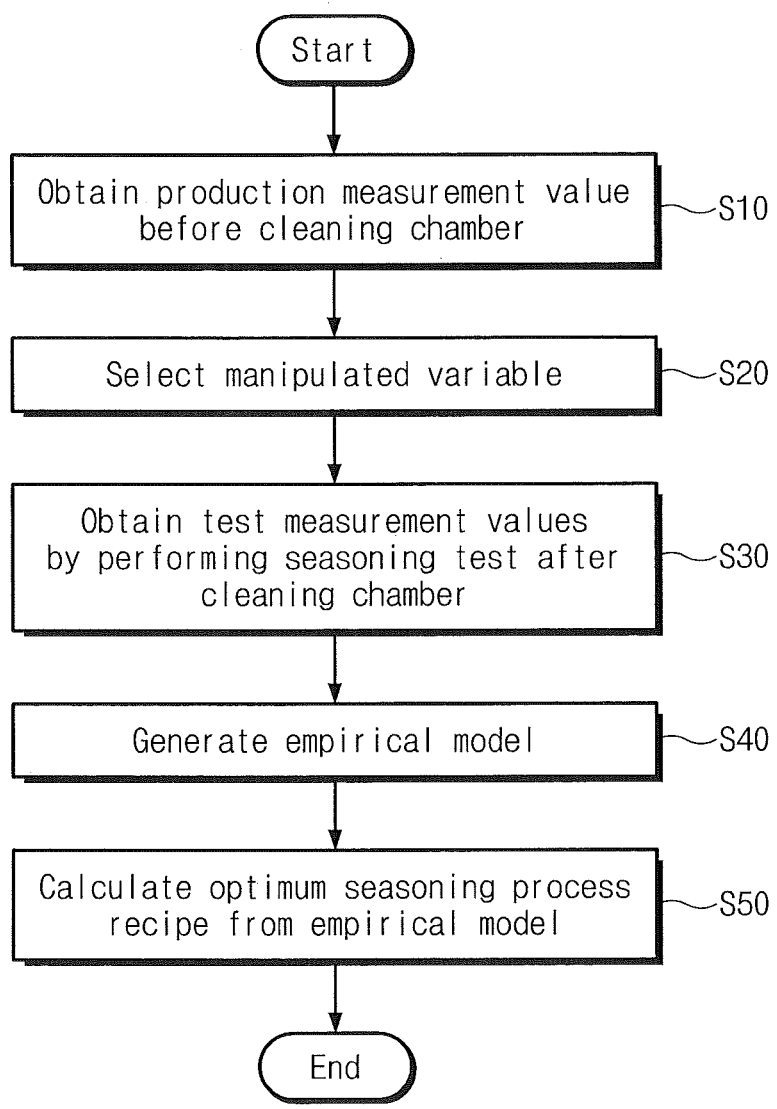
FIG. 3 is a flowchart illustrating a method of optimizing a seasoning process of the semiconductor device manufacturing equipment according to the example embodiment of the inventive concepts.

FIG. 3 is a flowchart illustrating the method of optimizing the seasoning process of the semiconductor device manufacturing equipment 100 according to an example embodiment of the inventive concepts.

Referring to FIG. 3, a production measurement value is obtained from the stabilized plasma reaction in the chamber 10 during the semiconductor device production process in operation S10. The production measurement value may include the optical and electrical characteristics of the plasma reaction induced in the chamber 10 during the semiconductor device production process of the patterned wafer. The semiconductor production process may be performed according to an optimized production process recipe. The production measurement value may be obtained from the first to third plasma sensors 42, 44, and 46 which measure the plasma reaction. The production measurement value may include measurement values of at least one of the first to third plasma sensors 42, 44, and 46 where a relative difference of the plasma reaction of the patterned wafer and the bare wafer is large in the chamber 10 where the semiconductor device production process is performed. In detail, the production measurement value may be the measurement value of the patterned wafer whose difference is large in comparison with the bare wafer. The measurement value of the patterned wafer may be higher than or lower than that of the bare wafer.

For instance, the semiconductor production process may include a process of forming a Shallow Trench Isolation (STI)

trench of the wafer. The trench forming process may include a Break Through (BT) process for removing a natural oxide layer on the surface of the wafer and a Main Etching (ME) process for forming the trench by removing crystalline silicon in the wafer. Also, in the case that a depth of the trench becomes deep, the trench forming process may include an Oxidation (OX) process for forming an oxide layer by exposing the internal crystalline silicon to oxygen after forming the trench to a predetermined depth through the BT and ME processes and additionally performed BT and ME processes. The production measurement value may be selected from peaks of spectrum graphs illustrated in FIGS. 4 and 5 measured by the OES during the BT and ME processes of the patterned wafer.

Figure 4:
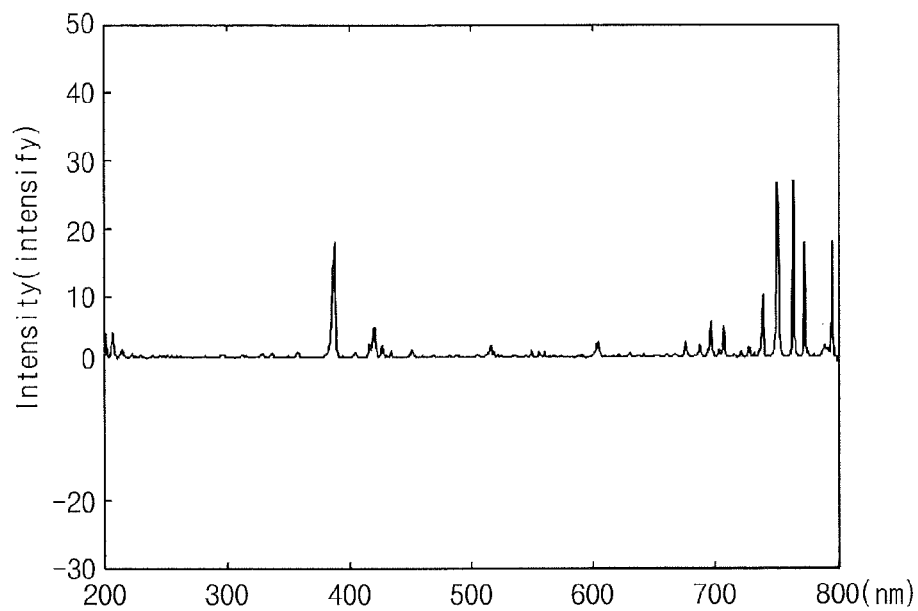
FIG. 4 is a spectrum graph of a plasma reaction at a break through (BT) etching process.
Figure 5:
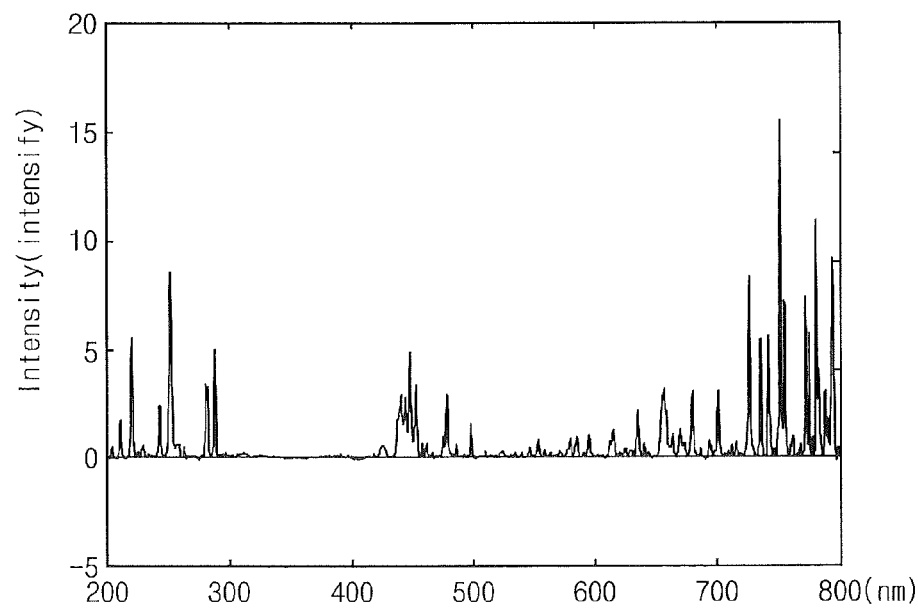
FIG. 5 is a spectrum graph of a plasma reaction at a main etching (ME) process.
Figure 6A:
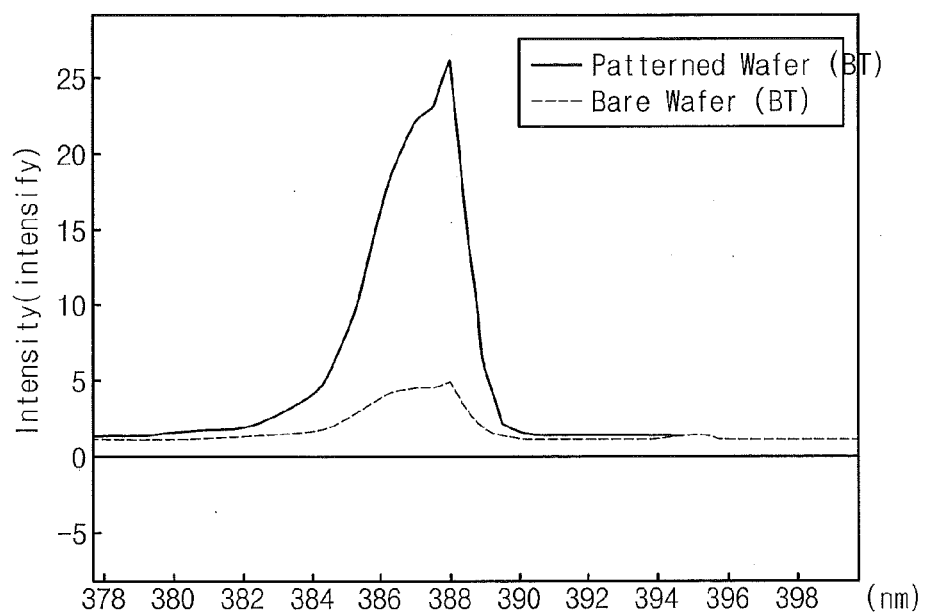
FIGS. 6A to 6D are diagrams illustrating spectrum graphs of a patterned wafer and a bare wafer corresponding to peak wavelength ranges of ranking 1 to ranking 4 of Table 1.
Figure 6B:
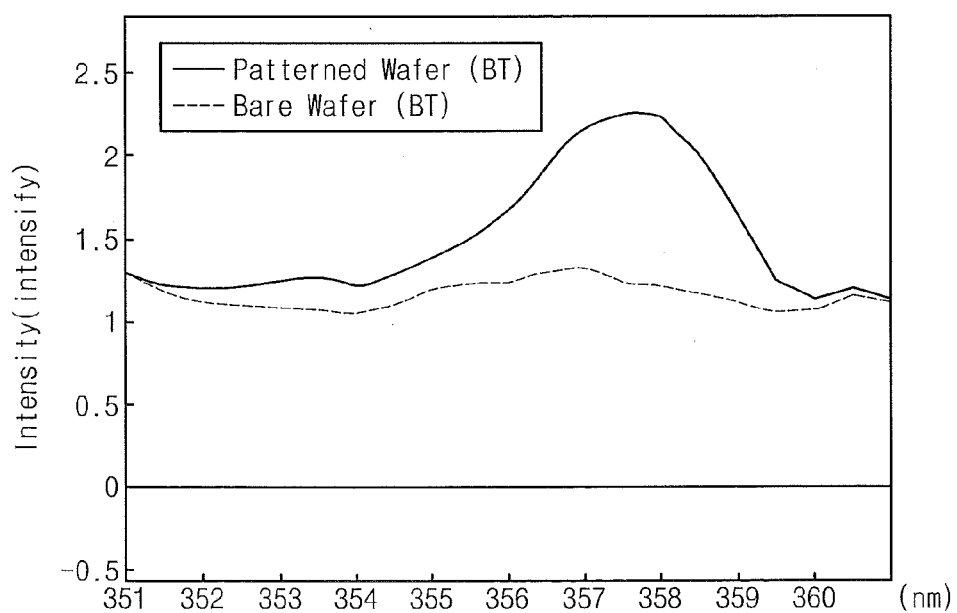
Figure 6C:
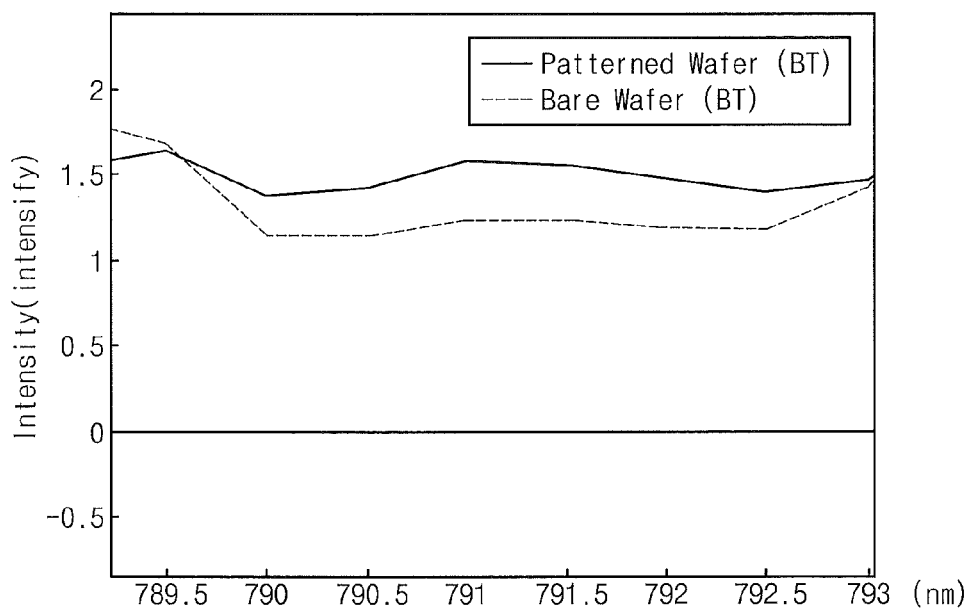
Figure 6D:
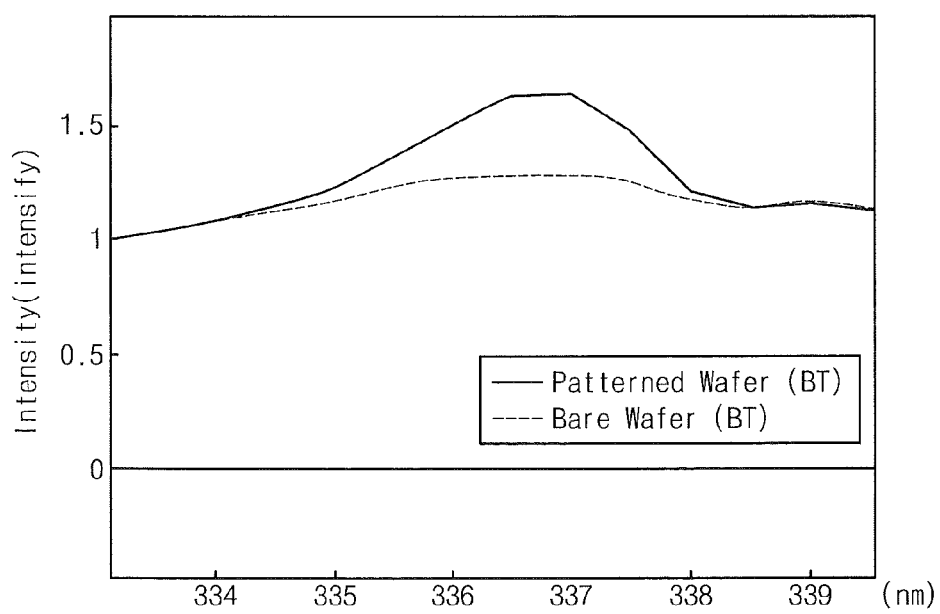
Figure 7A:
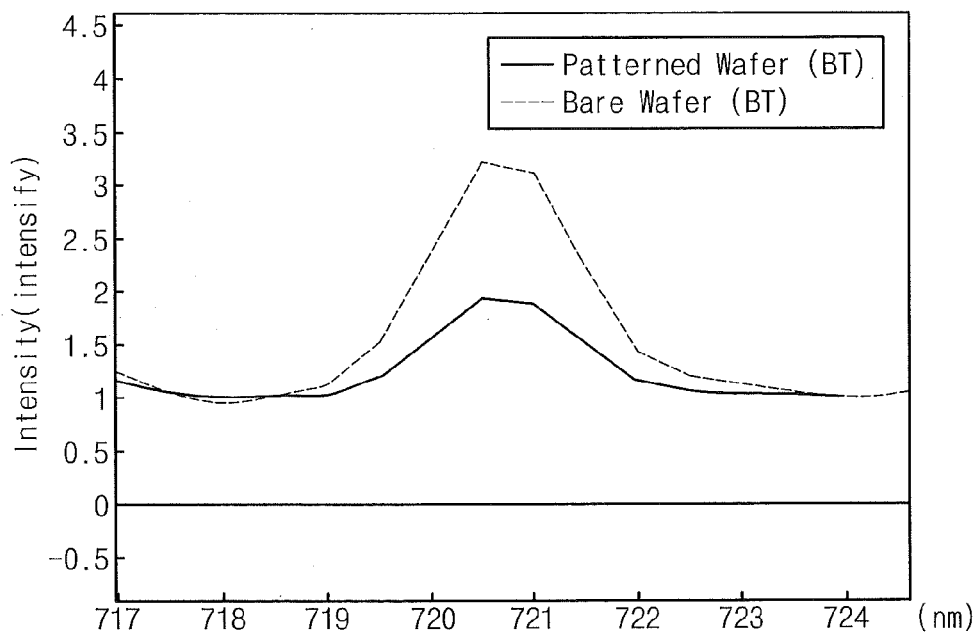
FIGS. 7A to 7D are diagrams illustrating spectrum graphs of a patterned wafer and a bare wafer corresponding to peak wavelength ranges of ranking 1 to ranking 4 of Table 2.
Figure 7B:
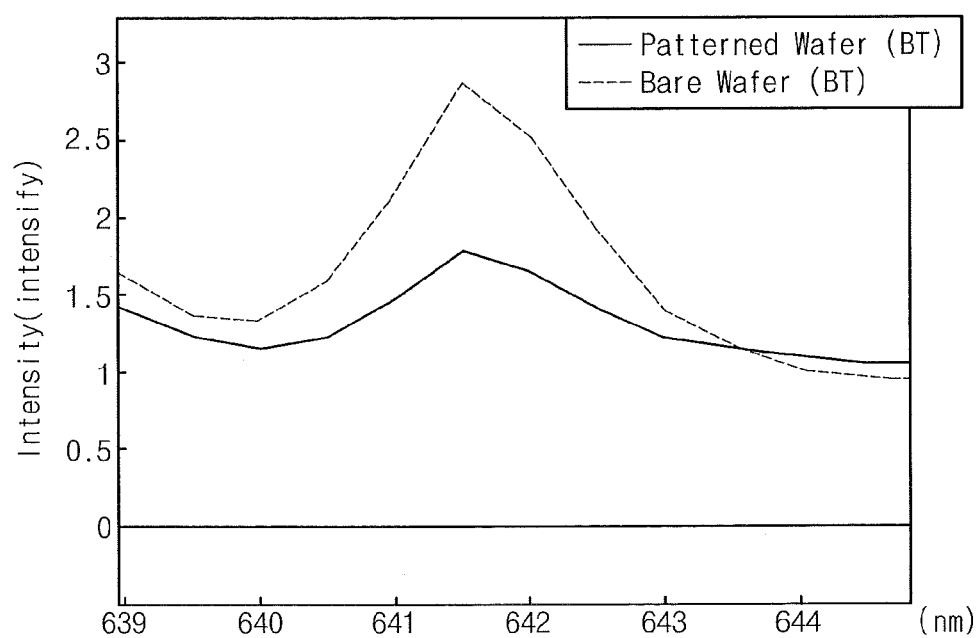
Figure 7C:
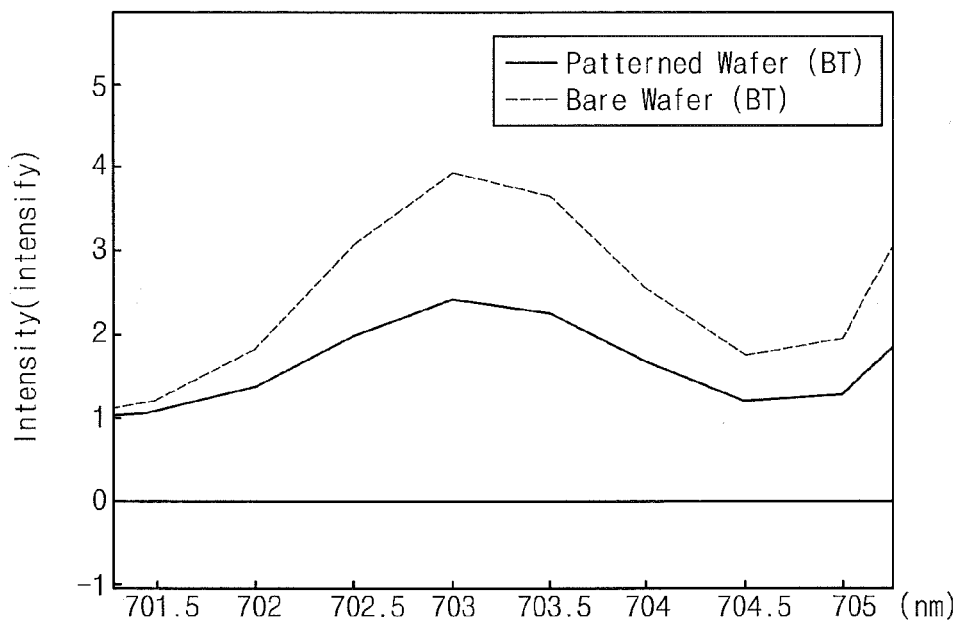
Figure 7D:
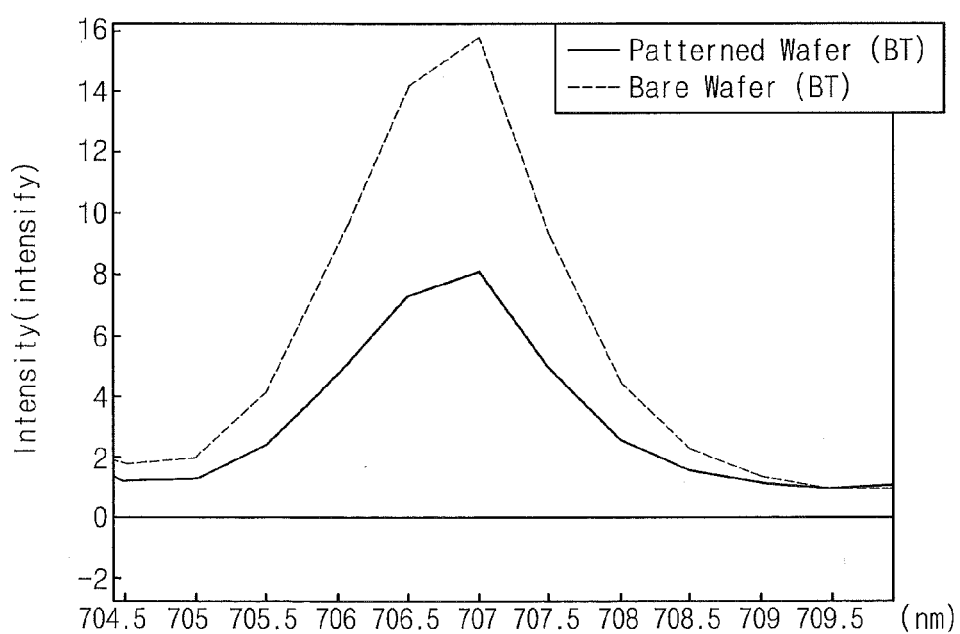
Figure 8A:
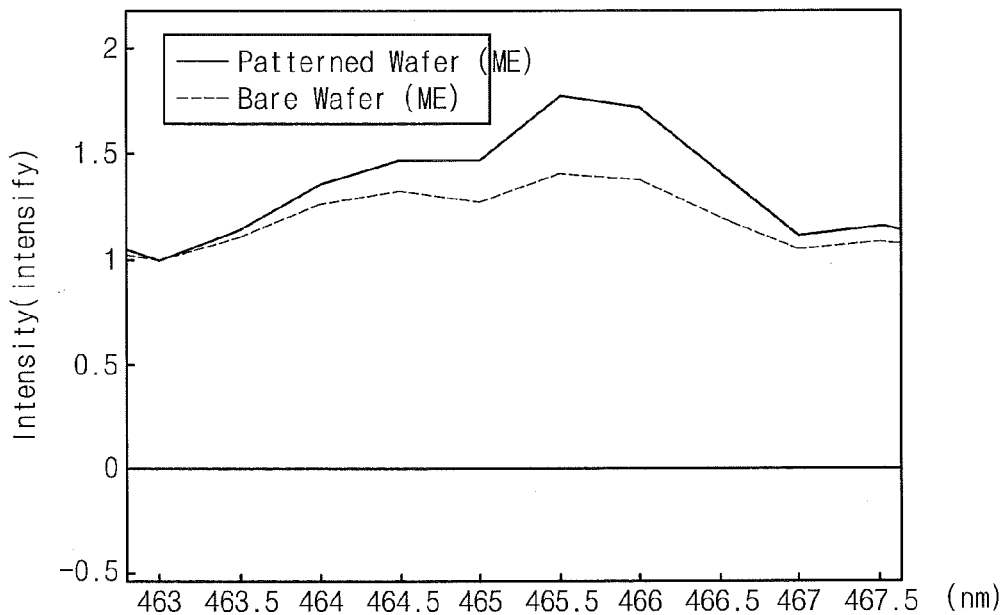
FIGS. 8A to 8D are diagrams illustrating spectrum graphs of a patterned wafer and a bare wafer corresponding to peak wavelength ranges of ranking 1 to ranking 4 of Table 3.
Figure 8B:
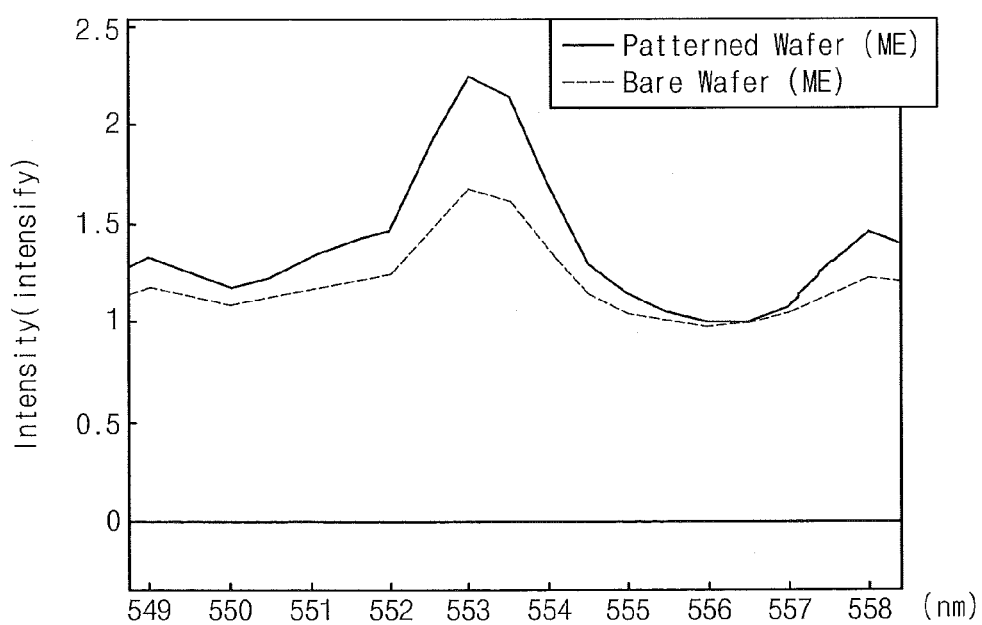
Figure 8C:
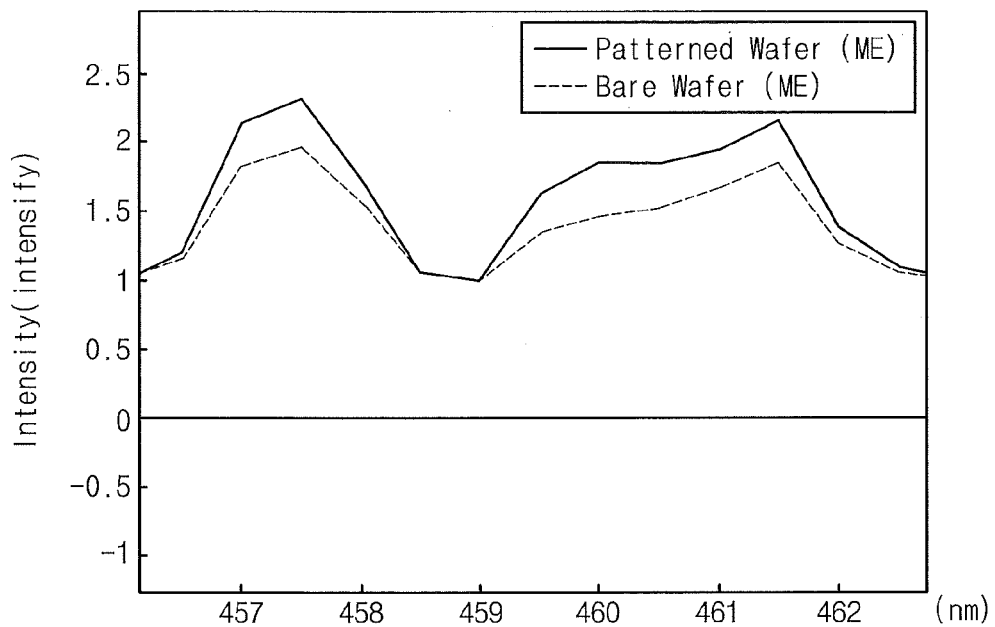
Figure 8D:
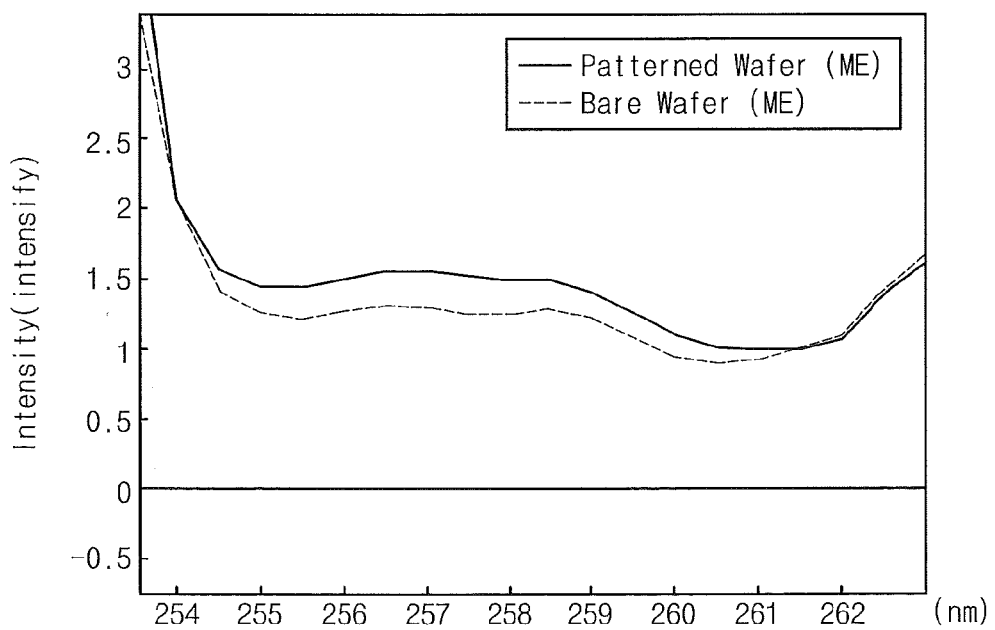

FIG. 4 is a spectrum graph of the plasma reaction at the BT process. FIG. 5 is a spectrum graph of the plasma reaction at the ME process. Herein, a horizontal axis denotes a spectrum wavelength of a visible light region, and a vertical axis denotes intensity of a spectrum peak.

Referring to FIGS. 4 and 5, the spectrum graphs at the BT and ME processes may have various peaks at the visible light region according to kinds of the reaction gas supplied into the chamber 10. The peak of the spectrum graph indicates optical unique characteristics of each corresponding element included in the reaction gas and may correspond to a particular wavelength range. In the spectrum graph, the wavelength range denoted by the peak may be called as a peak wavelength range for easy understand.

The peak wavelength range may be not changed if the kinds of the wafers etched by the reaction gas are the same. During the BT and ME processes of the patterned wafer, the plasma reaction may generate the spectrum of the visible light region corresponding to the graphs of FIGS. 4 and 5. In the case of changing the wafer from the patterned wafer to the bare wafer, the spectrum having the same peak wavelength range as the graphs of FIGS. 4 and 5 may be mostly measured. That is, in the case that the spectrum graphs of the plasma reaction at the etch processes of the patterned wafer and the bare wafer are overlapped with each other, most of the peak wavelength ranges may accord to each other. This is because the patterned wafer and the bare wafer may generate the byproducts of the plasma reaction of nearly same elements at the BT and ME processes respectively.

Although the peak wavelength ranges of the patterned wafer and the bare wafer may correspond with each other, the quantity of the byproducts of the plasma reaction at the etch processes of the patterned wafer and the bare wafer may be different. Thus, the patterned wafer and the bare wafer may have different values of intensity at the spectrum graph corresponding to the peak wavelength range. A gap between intensity values may be proportional to a difference between byproducts quantities of the plasma reaction corresponding to the corresponding peak wavelength range. This means that the difference between byproducts quantities of the plasma reaction is generated because subject materials of the etching are different from each other. Accordingly, the production measurement value may include a spectrum intensity value of the patterned wafer which is largely different from the bare wafer at the peak wavelength range of the spectrum. For instance, a ratio of the spectrum intensity values of the patterned wafer and the bare wafer at the BT process may be ranked in percentage as shown in Tables 1 and 2.

TABLE 1

| ranking | Patterned wafer/Bare wafer × 100% | Peak wavelength | Corresponding elements of peak wavelength |
|---|---|---|---|
| 1 | 539.8% | 388.0 nm | CN |
| 2 | 425.0% | 357.5 nm | NO, $N_2$, Cr, Zr |
| 3 | 139.1% | 791.0 nm | |
| 4 | 128.2% | 337.0 nm | $CO_2$, NH, $O_2$, Ti, $O_2$, $N_2$ |

TABLE 2

| ranking | Bare wafer/Patterned wafer × 100% | Peak wavelength | Corresponding elements of peak wavelength |
|---|---|---|---|
| 1 | 139.3% | 720.5 nm | F |
| 2 | 138.3% | 641.5 nm | Ga, F, $O_2$, Ar |
| 3 | 109.2% | 703.0 nm | Ar |
| 4 | 108.2% | 707.0 nm | Ar |

As shown in Table 1, the patterned wafer may generate the byproduct of carbon nitride (CN) corresponding to the peak wavelength range of about 388.0 nm with about 539.8% intensity in comparison with the bare wafer at the plasma reaction. Also, the patterned wafer may generate at least one byproduct of nitrous oxide (NO), nitrogen ($N_2$), chrome (Cr), and zirconium (Zr) corresponding to the peak wavelength range of about 357.5 nm with about 425.0% intensity in comparison with the bare wafer. Likewise, the patterned wafer may generate the byproduct corresponding to the peak wavelength ranges of about 791.0 nm and about 337.0 nm with about 139.1% intensity and about 128.2% intensity in comparison with the bare wafer.

As shown in Table 2, the bare wafer may generate the byproduct of fluorine (F) corresponding to the peak wavelength range of about 720.5 nm with about 139.3% intensity in comparison with the patterned wafer at the plasma reaction. Also, the bare wafer may generate at least one byproduct of gallium, fluorine, oxygen, and argon corresponding to the peak wavelength range of about 641.5 nm with about 138.3% intensity in comparison with the patterned wafer. Likewise, the bare wafer may generate the byproduct corresponding to the peak wavelength ranges of about 703.0 nm and about 707.0 nm with about 109.2% intensity and about 108.2% intensity respectively in comparison with the patterned wafer.

Accordingly, the patterned wafer and the bare wafer may generate the byproducts corresponding to the wavelength range where the spectrum intensity gap is large in different quantities at the BT process. The patterned wafer and the bare wafer may generate different quantities of the byproducts according to the rank orders shown in Tables 1 and 2. The production measurement value may include the spectrum intensity value of the patterned wafer at the BT process. For instance, the production measurement value may be selected from 8 wavelength ranges at the BT process.

FIGS. 6A to 6D are diagrams illustrating spectrum graphs of the patterned wafer and the bare wafer corresponding to the peak wavelength ranges of the ranking 1 to ranking 4 of Table 1. Referring to FIGS. 6A to 6D, it is shown that the difference of peak values of the ranking 1 to ranking 4 of Table 1 is gradually decreased. The production measurement value corresponding to the ranking 1 to ranking 4 is the peak value of the patterned wafer and may include about 26, about 23, about 1.5, and about 1.6 at the corresponding peak wavelength range.

FIGS. 7A to 7D are diagrams illustrating spectrum graphs of the patterned wafer and the bare wafer corresponding to the peak wavelength ranges of the ranking 1 to ranking 4 of Table 2. As shown in FIGS. 7A to 7D, the production measurement value corresponding to the ranking 1 to ranking 4 of Table 2 is the peak value of the patterned wafer and may include about 2, about 1.7, about 2.4, and about 8 at the corresponding peak wavelength range.

Accordingly, about 8 numbers of the production measurement value of the BT process may be obtained at the peak wavelength range where the difference between the patterned wafer and the bare wafer from the spectrum of the plasma reaction is large.

A ratio of the spectrum intensity values of the patterned wafer and the bare wafer at the ME process may be ranked in percentage as shown in Tables 3 and 4.

TABLE 3

| ranking | Patterned wafer/bare wafer × 100% | Peak wavelength | Corresponding elements |
|---|---|---|---|
| 1 | 89.2% | 465.5 nm | AlO, CO, SiBr, Ar |
| 2 | 85.4% | 553.0 nm | |
| 3 | 83.2% | 460.0 nm | CCl, CO, N, P |
| 4 | 77.4% | 256.5 nm | CCl, $Cl_2$ |

TABLE 4

| ranking | Bare wafer/Patterned wafer × 100% | Peak wavelength | Corresponding elements |
|---|---|---|---|
| 1 | 43.0% | 328.5 nm | Ag, $N_2$ |
| 2 | 42.8% | 282.0 nm | $O_2$, He, $N_2$, AsF, SiCl |
| 3 | 40.5% | 281.0 nm | SiCl, OH, $N_2$ |
| 4 | 34.0% | 334.0 nm | N2, Hg, Ti, GaCl, Ti, Zn |
| 5 | 28.5% | 243.5 nm | Au, Si, $As_2$ |
| 6 | 26.1% | 336.0 nm | NH, SiF |

As shown in Table 3, the bare wafer may generate at least one byproduct of aluminum oxide (AlO), carbon oxide (CO), silicon bromide (SiBr), and argon (Ar) corresponding to the peak wavelength range of about 465.5 nm with about 89.2% intensity in comparison with the patterned wafer at the plasma reaction. Also, the bare wafer may generate the byproduct corresponding to the peak wavelength range of about 553.0 nm with about 85.4% intensity in comparison with the patterned wafer. Likewise, the bare wafer may generate the byproduct corresponding to the peak wavelength ranges of about 460.0 nm and about 256.5 nm with about 83.2% intensity and about 77.4% intensity in comparison with the patterned wafer.

As shown in Table 4, the bare wafer may generate the byproduct such as silver (Ag) and nitrogen ($N_2$) corresponding to the peak wavelength range of about 328.5 nm with about 43.0% intensity in comparison with the patterned wafer at the plasma reaction. Also, the bare wafer may generate at least one byproduct of oxygen ($O_2$), helium (He), nitrogen ($N_2$), arsenic fluoride (AsF), and silicon chloride (SiCl) corresponding to the peak wavelength range of about 282.0 nm with about 42.8% intensity in comparison with the patterned wafer. Likewise, the bare wafer may generate the byproduct corresponding to the peak wavelength ranges of about 281.0 nm, about 334.0 nm, about 243.5 nm, and about 336.0 nm with about 40.5% intensity, about 34.0% intensity, about 28.5% intensity, and about 26.1% intensity respectively in comparison with the patterned wafer.

Accordingly, the patterned wafer and the bare wafer may generate the byproducts corresponding to the wavelength range where the spectrum intensity gap is large in different quantities at the ME process. The patterned wafer and the bare wafer may generate different quantities of the byproducts according to the rank orders shown in Tables 3 and 4. The production measurement value may include the spectrum intensity value of the patterned wafer at the ME process. For instance, the production measurement value may be selected from 10 wavelength ranges at the ME process.

FIGS. 8A to 8D are diagrams illustrating spectrum graphs of the patterned wafer and the bare wafer corresponding to the peak wavelength ranges of the ranking 1 to ranking 4 of Table 3. Referring to FIGS. 8A to 8D, it is shown that the difference of peak values of the ranking 1 to ranking 4 of Table 3 is gradually decreased. The production measurement value corresponding to the ranking 1 to ranking 4 is the peak value of the patterned wafer and may include about 1.8, about 2.3, about 1.9, and about 1.5 at the corresponding peak wavelength range.

Figure 9A:
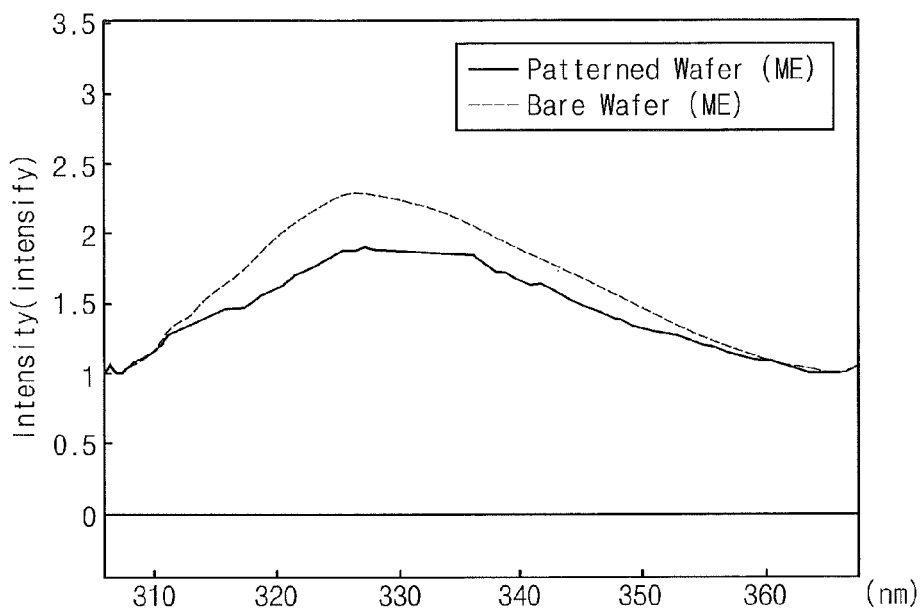
FIGS. 9A to 9C are diagrams illustrating spectrum graphs of a patterned wafer and a bare wafer corresponding to peak wavelength ranges of ranking 1 to ranking 6 of Table 4.
Figure 9B:
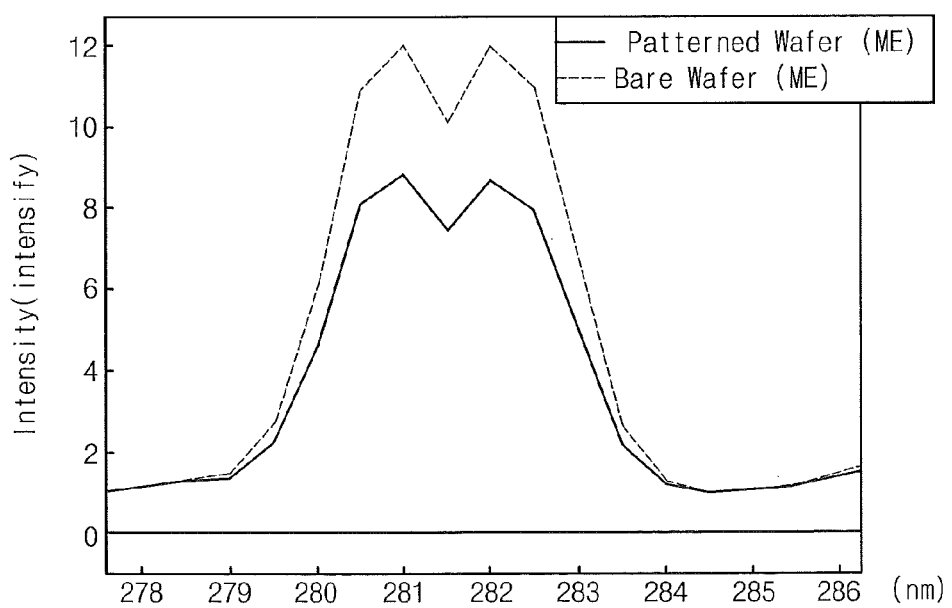
Figure 9C:
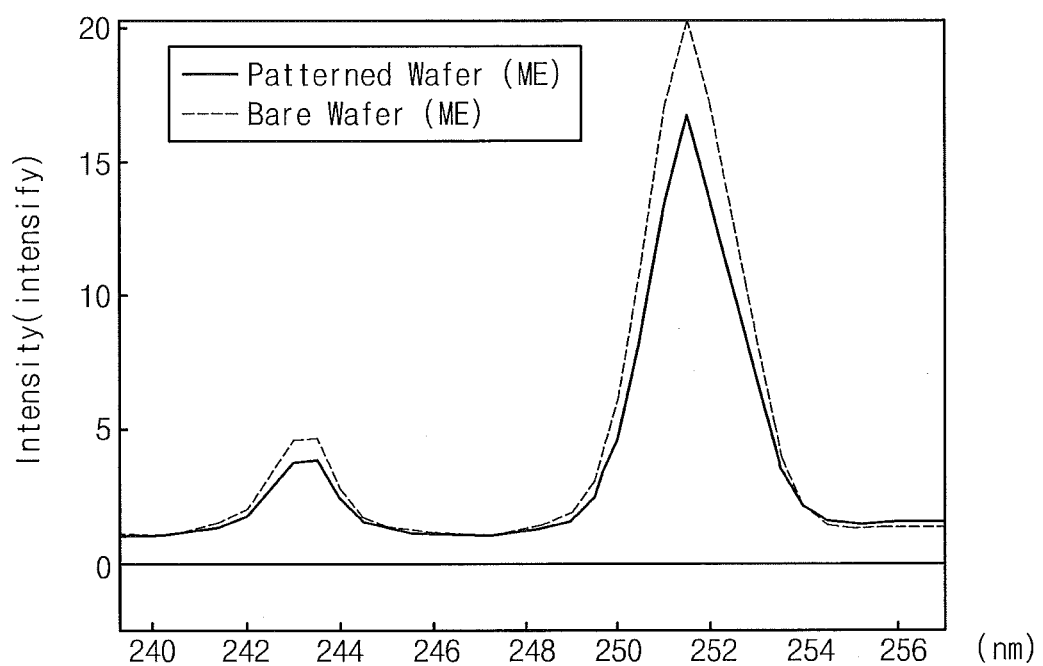

FIGS. 9A to 9C are diagrams illustrating spectrum graphs of the patterned wafer and the bare wafer corresponding to the peak wavelength ranges of the ranking 1 to ranking 6 of Table 4. As shown in FIGS. 9A to 9C, the production measurement value corresponding to the ranking 1 to ranking 6 of Table 4 is the peak value of the patterned wafer and may include about 1.9, about 8.7, about 8.8, about 1.9, about 4, and about 1.9 at the corresponding peak wavelength range.

Accordingly, about 10 numbers of the production measurement value of the ME process may be obtained at the peak wavelength range where the difference between the patterned wafer and the bare wafer from the spectrum of the plasma reaction is large.

Referring to FIG. 3 again, manipulated variables which greatly affect the change of the plasma reaction are selected at the reference process recipe in operation S20. The plasma reaction may be independently generated in the inside of the chamber 10. The plasma reaction may be changed mostly due to the kinds and flow rate of the reaction gas supplied into the chamber 10, pressure, and high frequency power. The reaction gas may include material reactive to the patterned wafer. Accordingly, the reaction gas may greatly affect the optical characteristics and electrical characteristics of the plasma reaction. The patterned wafer may be etched by 2 or more kinds of the reaction gases. For instance, the BT process of the patterned wafer may be performed by the reaction gas comprising carbon tetrafluoride and nitrogen. Also, the ME process of the patterned wafer may be performed by the reaction gas comprising chlorine and bromic acid. The OX process of the patterned wafer may be performed by the reaction gas comprising oxygen and the high frequency power inducing the plasma reaction.

Accordingly, the manipulated variables may include a control value related to at least one reaction gas, the internal pressure of the chamber 10, and the high frequency power controlled by the first to third flow control units 32, 34, and 36. For instance, the manipulated variables may include a flow rate value of a first reaction gas, a flow rate value of a second reaction gas, and a pressure value.

Next, the plurality of test measurement values is obtained by performing the seasoning tests of the chamber 10 varying the manipulated variables after cleaning the chamber 10 in operation S30. The seasoning tests may be performed by a regression analysis of the manipulated variables. The number of performing the seasoning tests may be increased in proportion to the number of the manipulated variables. For instance, the seasoning tests may be performed with design of experiment. The design of experiment may minimize the number of the seasoning tests of the chamber 10 according to variation of the manipulated variables. The design of experiment may include a factorial experiment design and an orthogonal experiment design. The factorial experiment design may include a Box-Benken method which is a kind of a response surface method.

Figure 10:
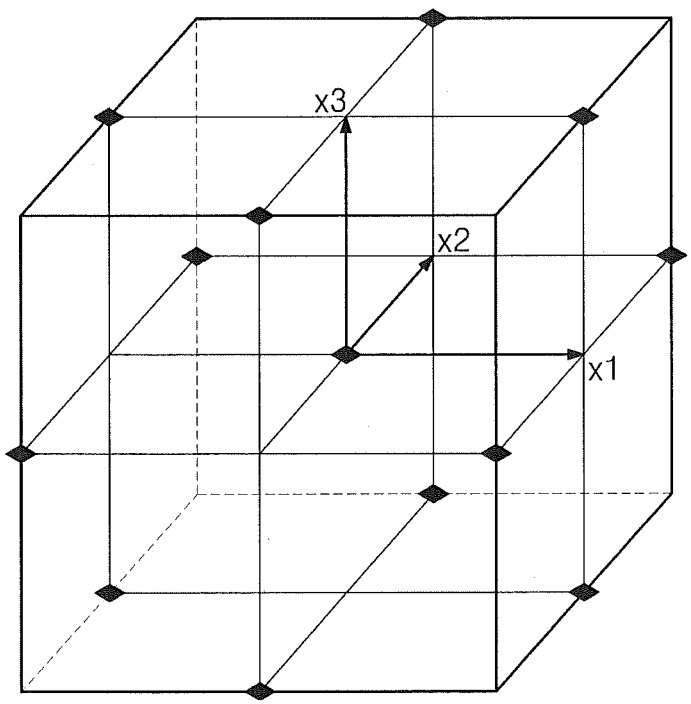
FIG. 10 is a diagram for explaining a Box-Benken method.

FIG. 10 is a diagram for explaining the Box-Benken method. The Box-Benken method may include experiments corresponding to 12 dots at the outside of a cube having a coordinate system where 3 manipulated variables are orthogonal to each other. Also, the Box-Benken method may include 3 times of experiment corresponding to a single dot at an internal center of the cube. Accordingly, the Box-Benken method may include 15 times of experiment. The 15 times of seasoning test process according to the Box-Benken method for each of the BT and ME processes may be performed as shown in Table 5.

TABLE 5

| No. | BT seasoning test process | | | ME seasoning test process | | |
|---|---|---|---|---|---|---|
| | carbon tetrafluoride ($CF_4$) | Nitrogen ($N_2$) | Pressure | Chlorine ($Cl_2$) | Bromic acid (HBr) | Pressure |
| 1 | 20 | 5 | 70 | 150 | 150 | 40 |
| 2 | 60 | 10 | 70 | 80 | 150 | 70 |
| 3 | 100 | 5 | 70 | 80 | 220 | 40 |
| 4 | 60 | 5 | 45 | 220 | 220 | 40 |
| 5 | 60 | 0 | 20 | 220 | 150 | 10 |
| 6 | 60 | 10 | 20 | 150 | 220 | 70 |
| 7 | 20 | 10 | 45 | 150 | 150 | 40 |
| 8 | 20 | 0 | 45 | 150 | 80 | 70 |
| 9 | 60 | 5 | 45 | 80 | 80 | 40 |
| 10 | 100 | 0 | 45 | 150 | 80 | 10 |
| 11 | 60 | 0 | 70 | 220 | 150 | 70 |
| 12 | 100 | 5 | 20 | 150 | 220 | 10 |
| 13 | 20 | 5 | 20 | 220 | 80 | 40 |
| 14 | 60 | 5 | 45 | 80 | 150 | 10 |
| 15 | 100 | 10 | 45 | 150 | 150 | 40 |

At the BT seasoning test process, the carbon tetrafluoride may be controlled to have flow rates of about 20 SCCM, about 60 SCCM, and about 100 SCCM. The nitrogen may be controlled to have flow rates of about 0 SCCM, about 5 SCCM, and about 10 SCCM. The pressure may be adjusted to about 20 mTorr, about 45 mTorr, and 70 mTorr. The supplied flow rates of carbon tetrafluoride and nitrogen and the pressure within the chamber 10 may be varied based on the Box-Benken method having the combination of Table 4. 4th, 9th, and 14th tests for the BT seasoning test process may be performed supplying the carbon tetrafluoride and nitrogen with flow rates of about 60 SCCM and about 5 SCCM respectively under a pressure of about 45 mTorr.

At the ME seasoning test process, each of the chlorine and bromic acid may be controlled to have flows rates of about 80 SCCM, about 150 SCCM, and about 220 SCCM, and the pressure may be adjusted to about 10 mTorr, about 40 mTorr, and about 70 mTorr. At the BT and ME seasoning test processes, the test measurement values may be obtained through at least one of first to third measurers. For instance, the test measurement values may include the intensity value of the production measurement value at the spectrum wavelength range. 1st, 7th, and 15th tests for the ME seasoning test process may be performed supplying the chlorine and bromic acid with flow rates of about 150 SCCM under a pressure of about 40 mTorr.

Next, an empirical model is generated according to a correlation of the test measurement value and the manipulated variables in operation S40. The empirical model may more continuously express the relation of the test measurement values and the manipulated variables for each spectrum wavelength range. That is, the test measurement values may be expressed as a relational expression of the manipulated variables. For instance, the test measurement values may be expressed in a second-order polynomial expression corresponding to the relation of the manipulated variables as Equation (1).

$$y_{1,1} = a_1 x_1^2 + b_1 x_2^2 + c_1 x_3^2 + d_1 x_1 x_2 + \\ e_1 x_1 x_3 + f_1 x_2 x_3 + g_1 x_1 + h_1 x_2 + i_1 x_3 + j_1$$

$$y_{1,2} = a_1 x_1^2 + b_1 x_2^2 + c_1 x_3^2 + d_1 x_1 x_2 + e_1 x_1 x_3 + \\ f_1 x_2 x_3 + g_1 x_1 + h_1 x_2 + i_1 x_3 + j_1$$

$$\vdots$$

$$y_{1,14} = a_1 x_1^2 + b_1 x_2^2 + c_1 x_3^2 + d_1 x_1 x_2 + \\ e_1 x_1 x_3 + f_1 x_2 x_3 + g_1 x_1 + h_1 x_2 + i_1 x_3 + j_1$$

$$y_{1,15} = a_1 x_1^2 + b_1 x_2^2 + c_1 x_3^2 + d_1 x_1 x_2 + e_1 x_1 x_3 + \\ f_1 x_2 x_3 + g_1 x_1 + h_1 x_2 + i_1 x_3 + j_1$$

(1)

$y_{1,1}$ to $y_{1,15}$ may include the test measurement values at the spectrum wavelength range of the first ranking in 15 times of test experiment based on the Box-Benken method. $x_1$ to $x_3$ are process conditions for obtaining the corresponding test measurement values and may include values of the manipulated variables at the corresponding test. $a_1, b_1, c_1, d_1, e_1, f_1, g_1, h_1, i_1, j_1$ are coefficients at the spectrum wavelength range of the first ranking. The coefficients may be calculated by 15 test measurement values and each value of the manipulated variables. Accordingly, the empirical model at the spectrum wavelength range of the first ranking may be generated as the second-order polynomial expression where the estimated calculation value corresponds to $y_1$. The empirical model may be generated as the respective second-order polynomial expressions corresponding to the estimated calculation values from $y_1$ to $y_8$ for the BT process. Also, the empirical model may be generated as the respective second-order polynomial expressions corresponding to the estimated calculation values from $y_1$ to $y_{10}$ for the ME process. That is, the empirical model may generate the respective second-order polynomial expressions corresponding to 8 estimated calculation values of the first to fourth rankings of each of Tables 1 and 2 during the BT process. Also, the empirical model may generate the respective second-order polynomial expressions corresponding to 10 estimated calculation values for the rankings of Tables 3 and 4 during the ME process.

Figure 11:
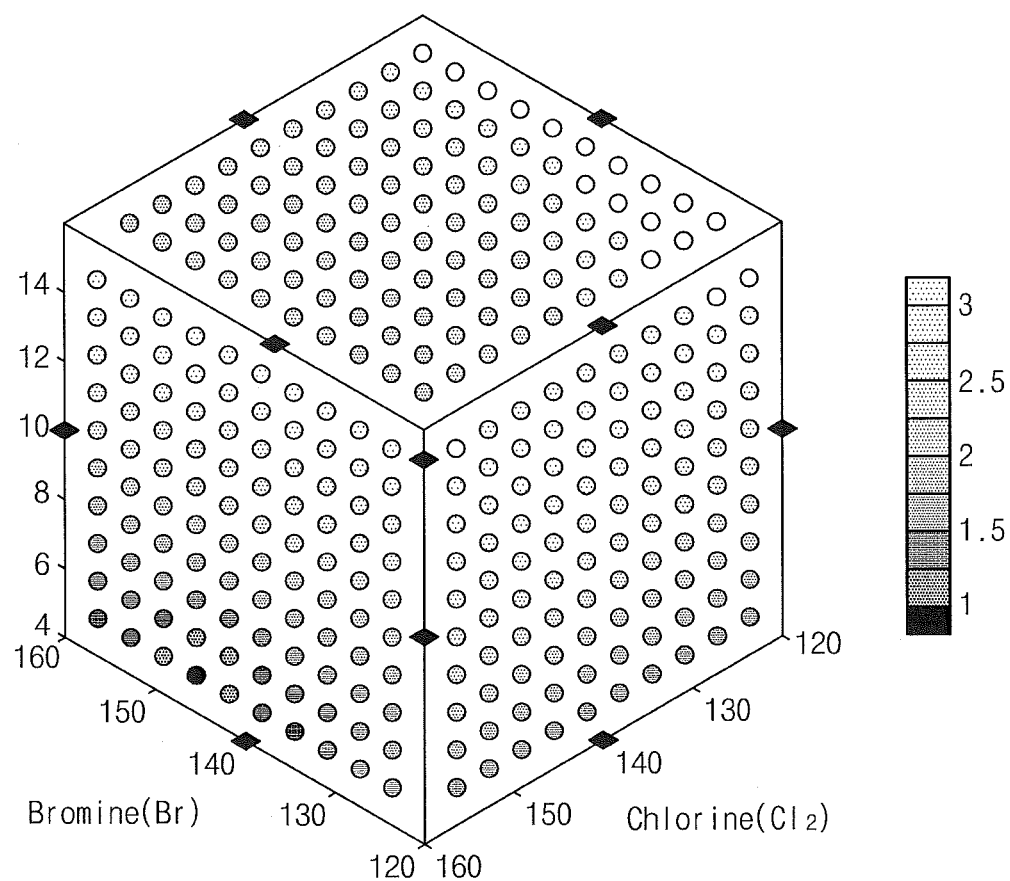
FIG. 11 is a diagram illustrating an empirical model which continuously expresses a relation of a test measurement value obtained through a test process performed according to a design of experiment using the Box-Benken method and manipulated test variables.

FIG. 11 is a diagram illustrating the empirical model which continuously expresses the relation of the test measurement value obtained through the test process performed according to the design of experiment configured to the Box-Benken method and the manipulated variables.

Referring to FIG. 11, the empirical model may express combination of the manipulated variables as dots at the test experiments performed according to the Box-Benken method. Herein, the dots corresponding to the combination of the manipulated variables should be expressed in three-dimensions; however, they are expressed on only planes of three coordinates in FIG. 11 because many dots may be overlapped with each other making it difficult to distinguish them. The empirical model may include the estimated values obtained from the combination of the manipulated variables.

Coordinate values of the estimated calculation values may correspond to the estimated seasoning process recipe. The empirical model may express the estimated calculation values following the production measurement value as square error. If the square error is very large, the estimated calculation value may be expressed as a circle whose inside is empty. The estimated calculation value of small square error may be expressed as a circle dot which is gradually buried. If the square error is smaller than about 1, the estimated calculation value may be expressed as a black circle dot. If the square error is larger than about 1, the estimated calculation value may be expressed as a circle dot whose inside is light. Rhombus dots express the test experiments of the Box-Benken method.

Accordingly, the empirical model may include the optimum combination of manipulated values corresponding to the estimated calculation value of small square error at the peak wavelength range of the corresponding ranking. Also, the empirical model may include the optimum estimated seasoning process recipe for the plasma reaction at the spectrum of the corresponding peak wavelength range. For instance, according to the optimum estimated seasoning process recipe at the ME process, chlorine is about 160 SCCM, bromine is about 140 SCCM, and the pressure is about 4 mTorr.

While the seasoning test process performed according to the Box-Benken method expresses 3 manipulated variables in three dimensions, the empirical model may express in four dimensions comprising the 3 manipulated variables and the estimated calculation values. As above-described, one empirical model may be generated for each spectrum wavelength range corresponding to the production measurement value. If the number of the production measurement values is respectively 8 and 10 at the BT and ME processes, 8 and 10 numbers of the empirical models may also be generated. In the empirical model, all the optimum combinations of the manipulated variables for each spectrum wavelength range do not coincide. This is because the estimated calculation values are statistical values for finding the optimum combination of the manipulated variables from 8 empirical models at the BT process and 10 empirical models at the ME process.

Referring to FIG. 3 again, finally, the optimum seasoning process recipe is produced from the empirical models in operation S50. The optimum seasoning process may be calculated in least-squares method by squaring the errors of the production measurement values and the estimated calculation values and adding all of them. The least-squares method may be expressed as Equation (2).

$$\sum_{i=1}^{n} w_i (CV_i - y_i)^2 \quad (2)$$

$w_i$ is a weight coefficient of the ith ranking, $CV_i$ is the production measurement value of the ith ranking, and $y_i$ is the estimated calculation value of the ith ranking. $w_i$ may be a randomly given constant according to importance of the ith ranking. If the estimated value is seen with the second-order polynomial expression of Equation (1), the production measurement values, i.e., $CV_i$ is a constant, and Equation (2) may be fourth polynomial expression having $x_1$, $x_2$, and $x_3$ as variables. 8 fourth polynomial expressions may be calculated at the BT process, and 8 fourth polynomial expressions may be calculated at the ME process. Each of the BT and ME processes may be expressed as Equation (2) of fourth polynomial expression. Accordingly, values of $x_1$, $x_2$, and $x_3$ having minimum value of fourth polynomial expression may be the optimum seasoning process recipe.

The minimum value of fourth polynomial expression may be a vertex approximate to $x_1$, $x_2$, and $x_3$ axis. For instance, the vertex may be calculated from a solution of a cubic equation to which the fourth polynomial expression is partial differentiated for $x_1$, $x_2$, and $x_3$. Also, the vertex may be calculated from optimization logic. In the case that the vertex exists out of a constraint range of the manipulated variables, a minimum manipulated variable within the corresponding constraint range may be selected as the optimum seasoning process recipe. The constraint range may include a variation range allowed at the semiconductor device production process. The optimum seasoning process recipe may be selected from each of the BT and ME processes.

Accordingly, since the optimum seasoning process recipe may be calculated based on the production measurement value of the semiconductor device production process, the method of optimizing the seasoning process of the semiconductor device manufacturing equipment 100 according to the example embodiment of the inventive concepts may increase the reproducibility of the seasoning process.

Further, the optimum seasoning process recipe may follow the same sequence as the production process recipe. In the chamber 10, if the trench of the STI becomes deeper than a certain depth, the production process comprising two times of silicon layer etch process may be performed. Accordingly, the seasoning process may be performed twice like the production process. For instance, for a process of forming the trench of about 300 nm depth, after BT1 (removing first natural oxide layer) process and ME1 (removing first silicon layer) process are performed, the OX (plasma oxide layer formation) process may be performed, and BT2 (removing second natural oxide layer) process and ME2 (removing silicon layer) process may be sequentially performed. Likewise, the seasoning process of the chamber 10 for forming the trench may also be performed in order of the BT1, ME1, OX, BT2, and ME2 processes. The optimum seasoning process recipe for them may be calculated as shown in Table 6.

TABLE 6

|  | BT1 seasoning process recipe | ME1 seasoning process recipe | OX seasoning process recipe | BT2 seasoning process recipe | ME2 seasoning process recipe |
|---|---|---|---|---|---|
| First flow control unit | 7 N$_2$ | 162 Cl$_2$ | 101 O$_2$ | 0 N$_2$ | 174 Cl$_2$ |
| Second flow control unit | 108 CF$_4$ | 174 HBr | 924 W | 73.0 CF$_4$ | 137 HBr |
| pressure | 43 mT | 65 mT | 4.5 mT | 26.5 mT | 4.0 mT |

For the BT1 seasoning process recipe, the supplying flow rate of nitrogen and carbon tetrafluoride and the pressure may be calculated higher in comparison with the BT2 seasoning process. The BT1 and BT2 processes may be performed by nitrogen and carbon tetrafluoride whose flow rates are controlled by the first and second flow control units. For the BT1 seasoning process recipe, nitrogen is about 7 SCCM, carbon tetrafluoride is about 108 SCCM, and the pressure is about 43 mTorr. On the contrary, for the BT2 seasoning process recipe, nitrogen is about 0 SCCM, carbon tetrafluoride is about 73.0 SCCM, and the pressure is about 26.5 mTorr. Accordingly, the BT1 seasoning process may be performed in a state of relatively high flow rate of the reaction gases and pressure in comparison with the BT2 seasoning process. Each of the BT1 and BT2 may be performed for about 10 seconds.

The OX seasoning process may be performed right after the ME1 seasoning process is completed. For the OX seasoning process recipe, oxygen is about 101 SCCM, the high frequency power is about 924 W, and the pressure is about 4.5 mTorr. The OX seasoning process may be performed for about 10 seconds.

The ME1 and ME2 processes may be performed after the BT1 and BT2 processes completed respectively. The ME1 and ME2 processes may be performed by chlorine and bromic acid whose flow rates are controlled by the first and second flow control units. For the ME1 and ME2 seasoning process recipes, the supplying flow rates of chlorine and bromic acid and the pressure may be differently calculated. For the ME1 seasoning process recipe, chlorine is about 162 SCCM, bromic acid is about 174 SCCM, and the pressure is about 65 mTorr. For the ME1 seasoning process recipe, chlorine is about 174 SCCM, bromic acid is about 137 SCCM, and the pressure is about 4.0 mTorr. The ME1 seasoning process may be performed in a state of mixed flow rates of the reaction gases and higher pressure in comparison with the ME2 seasoning process. Each of the ME1 and ME2 seasoning processes may be performed for about 30 seconds to about 2 minutes respectively.

Accordingly, the chamber 10 required to perform the etch process of sequential 5 steps at the semiconductor device production process may perform the seasoning process of 5 steps after the preventive maintenance comprising the wet-cleaning. The chamber 10 may be converted into the semiconductor device production process right after 5 seasoning processes performed for a predetermined time. For instance, the chamber 10 may perform the semiconductor device production process of the patterned wafer after completing the seasoning process of about 4 hour with the bare wafer.

As a result, since the seasoning process may be completed within short time by using the optimum seasoning process recipe calculated according to the measurement value of the semiconductor device production process, the method of optimizing the seasoning process of the semiconductor device manufacturing equipment 100 according to the example embodiment of the inventive concepts may increase or maximize the productivity and production yield.

As above-described, according to the inventive concepts, since the optimum seasoning process recipe can be calculated based on the production measurement of the semiconductor device production process, the reproducibility of the seasoning process can be increased.

Further, since the seasoning process can be completed within short time by using the optimum seasoning process recipe, the productivity and production yield can be increased or maximized.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method for seasoning semiconductor device manufacturing equipment, comprising:
    obtaining, by a control unit, at least one reference measurement value according to a reference process recipe of a plasma etching process before cleaning a chamber;
    selecting variables which affect the plasma etching process of the reference process recipe;
    cleaning the chamber to at least partially remove a polymer component thereon;
    obtaining, by a control unit, test measurement values by performing seasoning tests on the cleaned chamber, the seasoning tests being different from the plasma etching process, the test measurement values being associated with tests in which the selected variables are manipulated;
    estimating, by a control unit, at least one estimated calculation value approximate to the at least one reference measurement value;
    estimating, by a control unit, a seasoning process recipe from the at least one estimated calculation value; and
    seasoning the chamber according to the estimated seasoning process recipe,
    wherein the at least one reference measurement value comprises optical measurement values, and
    the selecting variables selects the variables based on a spectrum intensity difference of the plasma reaction between the reference process recipe and the seasoning process recipe.

2. The method of claim 1, wherein
    the estimating a seasoning process recipe includes generating an empirical model according to the correlation of the manipulated variables and the test measurement values.

3. The method of claim 2, wherein a number of the generated empirical models is equal to a number of the at least one reference measurement value.

4. The method of claim 2, wherein the empirical model generates the at least one estimated calculation value according to a combination of the manipulated variables.

5. The method of claim 4, wherein the at least one estimated calculation value is generated using a relational expression of the manipulated variables.

6. The method of claim 5, wherein the relational expression comprises a second-order polynomial expression of the manipulated variables.

7. The method of claim 6, wherein the empirical model comprises a square error of the at least one reference measurement value and the at least one estimated calculation value.

8. The method of claim 7, wherein the seasoning process recipe is determined using a least-squares method by adding a square error and minimizing the square error.

9. The method of claim 8, wherein the seasoning process recipe corresponds to a vertex estimated from the square error of the second-order polynomial expression.

10. The method of claim 1, wherein the seasoning tests are performed according to a regression analysis of the manipulated variables.

11. The method of claim 10, wherein the regression analysis comprises a design of experiment.

12. The method of claim 11, wherein the design of experiment comprises a Box-Benken method.

13. The method of claim 1, wherein the optical measurement values of the at least one reference measurement value have relative differences between the plasma etching process on a patterned wafer and the plasma etching process on a bare wafer according to the reference process recipe.

14. The method of claim 1, wherein the seasoning process recipe follows a same sequence as the reference process recipe.

15. The method of claim 14, wherein the seasoning process recipe comprises a first oxide layer seasoning process for removing a natural oxide layer performed according to the reference process recipe of a trench forming process and a first silicon layer seasoning process for removing a silicon layer.

16. The method of claim 15, wherein the seasoning process recipe further comprises the first oxide layer seasoning process, at least one oxide layer forming process sequentially performed following the first silicon layer seasoning process, a second oxide layer seasoning process, and a second silicon seasoning process.

17. A method for seasoning semiconductor device manufacturing equipment, comprising:

performing a plasma etching process in a reaction chamber using a production process recipe;

obtaining, by a control unit, at least one reference measurement value related to a byproduct of the generated the plasma etching process;

selecting variables which affect the plasma etching process;

cleaning the reaction chamber to at least partially remove a polymer component thereon;

performing a plurality of seasoning tests on the cleaned reaction chamber to obtain a plurality of test results, the seasoning tests being different from the plasma etching process, the plurality of test results being associated with tests in which the selected variables are manipulated;

generating, by a control unit, an empirical model by forming at least one relational expression correlating variables manipulated during the performing of the plurality of seasoning tests to the plurality of test results;

estimating, by a control unit, a seasoning process by using the at least one relational expression to estimate at least one estimated calculation value; and seasoning the reaction chamber using the seasoning process before performing another plasma etching process, wherein the at least one reference measurement value comprises optical measurement values, and the selecting variables selects the variables based on a spectrum intensity difference of the plasma reaction between the reference process recipe and the seasoning process recipe.

18. The method of claim 17, wherein the at least one relational expression is a second-order polynomial.

19. The method of claim 17, wherein the empirical model further includes a square error of the at least one reference measurement value and the at least one estimated calculation value.

20. The method of claim 1, wherein the polymer component is generated as byproducts of the plasma etching process and accumulated an inner wall of the chamber.

21. The method of claim 1, wherein the obtaining test measurement values by performing the seasoning test on the chamber is performed after cleaning the chamber.

22. The method of claim 1, wherein the seasoning test includes a preliminary etch process for coating the inner wall of the chamber with the polymer.

23. The method of claim 1, wherein the test measurement values are obtained by performing the seasoning tests to generate byproducts on a bare wafer, after cleaning the chamber, and comprise at least one of an optical measurement value.

* * * * *